United States Patent [19]
Tanihira et al.

[11] Patent Number: 5,497,459
[45] Date of Patent: Mar. 5, 1996

[54] SYSTEM FOR TESTING INSTRUCTION QUEUE CIRCUIT AND CENTRAL PROCESSING UNIT HAVING THE SYSTEM

[75] Inventors: Hisamitsu Tanihira, Iwaki; Renri Nakano; Kazuo Nagahori, both of Kawasaki, all of Japan

[73] Assignee: Fujitsu Limited, Kanagawa, Japan

[21] Appl. No.: 297,246

[22] Filed: Aug. 26, 1994

Related U.S. Application Data

[63] Continuation of Ser. No. 979,302, Nov. 20, 1992, abandoned.

[30] Foreign Application Priority Data

Nov. 20, 1991 [JP] Japan ................................ 3-331234

[51] Int. Cl.⁶ .......................... G06F 11/54; G06F 1/00; G11C 29/00
[52] U.S. Cl. ............................ 395/183.06; 364/265.3; 371/21.2
[58] Field of Search ........................ 395/575, 183.06, 395/183.01, 180; 364/939, 939.1, 939.6, 939.7, 265.3; 371/21.1, 21.2

[56] References Cited

U.S. PATENT DOCUMENTS

| 4,156,926 | 5/1979 | Hartman | 364/200 |
|---|---|---|---|
| 4,327,408 | 4/1982 | Foissell et al. | 395/575 |
| 4,546,430 | 10/1985 | Moore et al. | |
| 4,730,318 | 3/1988 | Bagholtz, Jr. et al. | 371/21.1 |
| 5,016,220 | 5/1991 | Yamagata | 371/21.1 |
| 5,226,149 | 7/1993 | Yoshida et al. | 395/575 |

OTHER PUBLICATIONS

Computer System Architecture, 2nd Ed., M. Morris Mano, 1982, Prentice Hall, Inc. Englewood Cliffs, NJ 07632, pp. 52–54, and pp. 356–358.

Primary Examiner—Robert W. Beausoliel, Jr.
Assistant Examiner—Trinh Tu

[57] ABSTRACT

In a system for testing an instruction queue circuit connected to an external memory via a bus controller provided in a processor having a microprogram control unit, an operation unit connected to the microprogram control unit and connected, via an internal bus, to the instruction queue circuit, the instruction queue circuit-including a plurality of queue buffers, a writing unit writes internal bus information transferred via the internal bus into the instruction queue circuit in response to a first instruction generated by the microprogram control unit. The internal bus information is contained in the first instruction. A reading unit reads the internal bus information from the instruction queue circuit in response to a second instruction generated by the microprogram control unit. A gate circuit outputs the internal bus information to the internal bus in response to a third instruction generated by the microprogram control circuit. The internal bus information is used to test the instruction queue circuit.

8 Claims, 11 Drawing Sheets

FIG. 8A

| TYP | | | | |
|---|---|---|---|---|
| 0 | //// | DST | DATA | NEXT |

FIG. 8B

| 1 | CTL | DST | SRC | ALU | NEXT |

FIG. 8C

| 000 | --- |
|---|---|
| 001 | --- |
| 010 | INPUT SOURCE |
| 011 | --- |
| ⋮ | ⋮ |
| 111 | --- |

SRC FIELD

FIG. 8D

| 000 | --- |
|---|---|
| 001 | QUEUE SWITCH |
| 010 | --- |
| ⋮ | ⋮ |
| 111 | --- |

CTL FIELD

FIG. 8E

| 000 | --- |
|---|---|
| 001 | --- |
| 010 | --- |
| 011 | --- |
| 100 | OUTPUT DESTINATION |
| 101 | --- |
| 110 | --- |
| 111 | --- |

DST FIELD

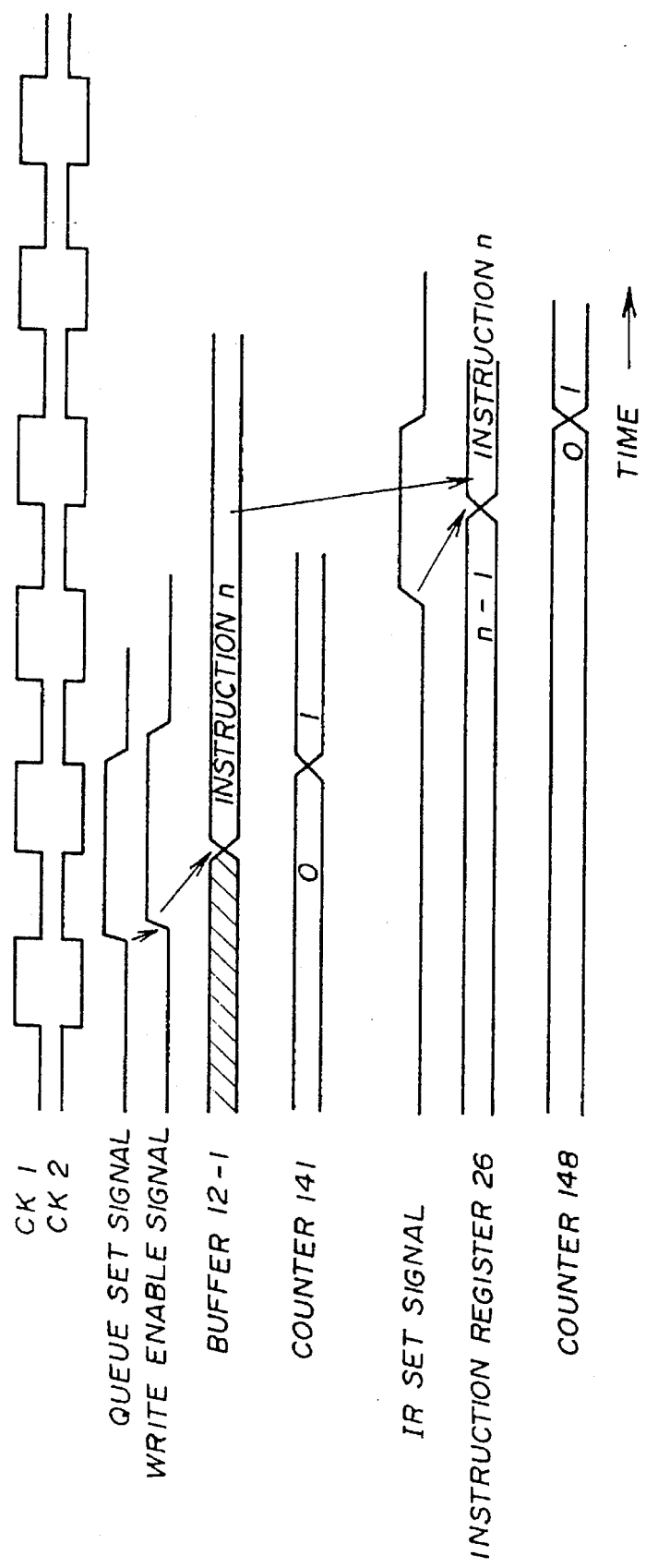

SYSTEM FOR TESTING INSTRUCTION QUEUE CIRCUIT AND CENTRAL PROCESSING UNIT HAVING THE SYSTEM

This is a continuation of application Ser. No. 07/979,302, filed Nov. 20, 1992 now abandoned.

BACKGROUND OF THE INVENTION

1. Field of the Invention

The present invention generally relates to central processing units and more particularly to a system for testing or diagnosing an instruction queue circuit provided in a central processing unit.

2. Description of the Related Art

In central processing units (CPUs), instructions are prefetched in advance of execution thereof in order to improve the instruction processing ability. The prefetched instructions are temporarily stored in a buffer memory called an instruction queue until they are executed. The instruction queue is employed in processors or CPUs in electronic exchanges and computers. It is necessary to test the instruction queue in order to discern whether or not the instruction queue has a fault.

FIG. 1 is a block diagram of a CPU 10. The CPU 10 comprises an instruction fetch unit 12, an instruction decoder unit 13, a microprogram control unit 14, an address calculation unit 15, an operation unit 16, a bus control unit 17, and a timing generator (TG) 18. The instruction fetch unit 12 includes an instruction queue circuit 11. A data bus DB and an address bus ADB are connected to the bus control unit 17. An internal bus BS1 connects the operation unit 16 and the bus control unit 17 to each other. An instruction bus BS2 connects the bus control unit 17 and the instruction fetch unit 12. The bus control unit 17 switches connections among the data bus DB, the address bus ADB, the internal bus BS1 and the instruction bus BS2.

FIG. 2 shows the details of the instruction fetch unit 12 shown in FIG. 1. The configuration shown in FIG. 2 comprises the instruction queue 11, a queue writing controller 24, a queue reading controller 25 and an instruction register (IR) 26. The instruction queue circuit 11 comprises four instruction queue buffers (IQ) 21-1–21-4, four multiple-bit AND gates 22-1–22-4, and an OR gate 23. The instruction queue buffers 21-1–21-4 are connected in parallel with the instruction bus BS2. An instruction transferred via the instruction bus BS2 is written in one of the registers 21-1–21-4 under the control of the queue writing controller 24, which sequentially selects the registers 21-1–21-4 one by one. The queue reading controller 25 sequentially selects the registers 21-1–21-4 one by one. The instruction read from one of the registers 21-1–21-4 is transferred to the instruction register 26 via the corresponding AND gate and the OR gate 23, and is written therein. Then, the instruction stored in the instruction register 26 is read therefrom and applied to the instruction decoder unit 13.

The operation of the configuration shown in FIG. 2 will now be described in detail below. The queue writing controller 24 supervises the status of the instruction queue buffers 21-1–21-4 and informs the address calculation unit 15 that an idle instruction queue buffer is available. When an idle instruction queue buffer is available, the address calculation unit 15 calculates an address in an external memory (not shown) connected to the data bus DB and the address bus ADB, and sends the address to the memory. An instruction is read from the memory and transferred via the instruction bus BS2. Then, the instruction is written into an idle instruction queue buffer under the control of the queue writing controller 24.

The queue reading circuit 25 receives a request from the instruction decoder unit 13, and specifies the instruction queue buffer in which the oldest instruction is stored. The instruction is read from the specified register and is transferred to the instruction register 26 via the corresponding AND gate and the OR gate 23. Then, the instruction is read from the instruction register 26 and is applied to the instruction decoder unit 13. The instruction decoder unit 13 decodes the received instruction and controls the microprogram control unit 14.

It is required to test the instruction queue circuit 11, that is, to determine whether or not the instruction queue circuit 11 operates normally. The process for testing the instruction queue circuit 11 is carried out in the following way. An instruction is read from the external memory via the bus control unit 17 and is written into the instruction queue circuit 11. Since the instruction queue circuit 11 has the four instruction queue buffers 21-1–21-4, four instructions should be read from the external memory and written into the registers. The instructions are read from the instruction queue circuit 11 one by one and are decoded by the instruction decoder unit 13. Then, the instructions are executed by the operation unit 16 one by one. It can be seen from the above that many structural elements must be driven in order to test the instruction queue circuit 11.

SUMMARY OF THE INVENTION

It is a general object of the present invention to provide a system for testing an instruction queue circuit in a central processing unit, in which the above disadvantages are eliminated.

A more specific object of the present invention is to provide a system for testing an instruction queue circuit in which the instruction queue circuit can be tested with high precision.

The above objects of the present invention are achieved by a system for testing an instruction queue circuit connected to an external memory via a bus controller provided in a processor having a microprogram control unit, an operation unit connected to the microprogram control unit and connected, via an internal bus, to the instruction queue circuit, the instruction queue circuit including a plurality of queue buffers, the system comprising: writing means, coupled to the instruction queue circuit and the microprogram control unit, for writing internal bus information transferred via the internal bus into the instruction queue circuit in response to a first instruction generated by the microprogram control unit, the internal bus information being contained in the first instruction; reading means, coupled to the instruction queue circuit and the microprogram control unit, for reading the internal bus information from the instruction queue circuit in response to a second instruction generated by the microprogram control unit; and gate means, coupled to the reading means, for outputting the internal bus information to the internal bus in response to a third instruction generated by the microprogram control circuit, the internal bus information being used to test the instruction queue circuit.

Another object of the present invention is to provide a processor having the above-mentioned system.

This object of the present invention is achieved by a processor comprising: an instruction queue circuit which is connected to an external memory via a bus controller and includes a plurality of queue buffers; a microprogram control unit; an operation unit connected to the microprogram control unit and connected, via an internal bus, to the instruction queue circuit; writing means, coupled to the instruction queue circuit and the microprogram control unit, for writing internal bus information transferred via the internal bus into the instruction queue circuit in response to a first instruction generated by the microprogram control unit, the internal bus information being contained in the first instruction; reading means, coupled to the instruction queue circuit and the microprogram control unit, for reading the internal bus information from the instruction queue circuit in response to a second instruction generated by the microprogram control unit; and gate means, coupled to the reading means, for outputting the internal bus information to the internal bus in response to a third instruction generated by the microprogram control circuit, the internal bus information being used to test the instruction queue circuit.

BRIEF DESCRIPTION OF THE DRAWINGS

Other objects, features and advantages of the present invention will become apparent from the following detailed description when read in conjunction with the accompanying drawings, in which:

FIGS. 8A, 8B, 8C, 8D and 8E are diagrams showing the types of microinstructions;

FIG. 11 is a timing chart showing the operation in an ordinary mode.

DESCRIPTION OF THE PREFERRED EMBODIMENTS

Figure 3:
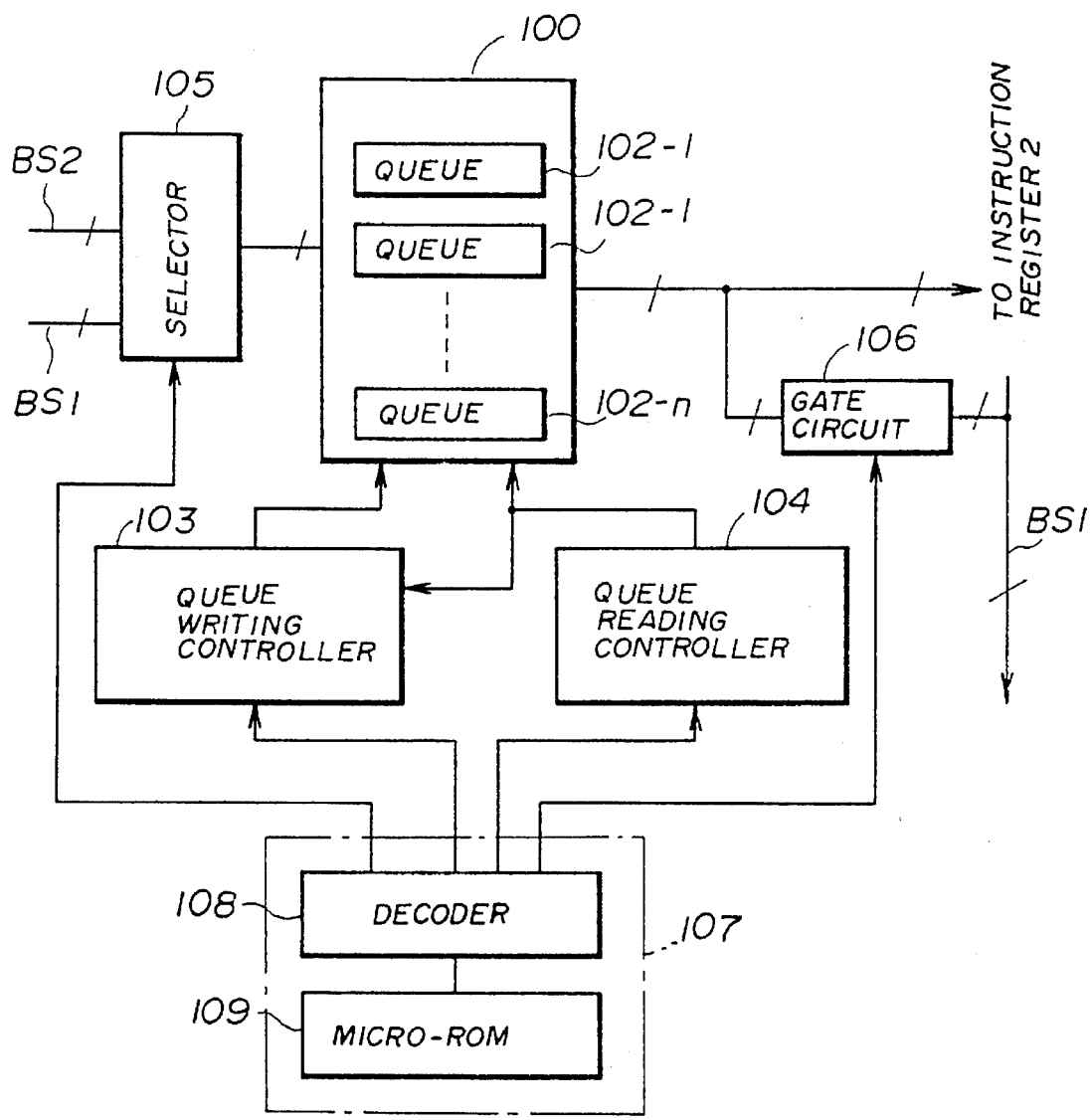
FIG. 3 is a block diagram showing an overview of an embodiment of the present invention.

FIG. 3 is a block diagram showing an overview of a system for testing an instruction queue circuit according to an embodiment of the present invention. The system shown in FIG. 3 is provided in the instruction fetch unit 12 of the CPU shown in FIG. 1. The system comprises an instruction queue circuit 100, which includes a plurality of instruction queue buffers 102-1–102-n where n is an integer. A queue writing controller 103, which is connected to the instruction queue circuit 100, executes a write control process for sequentially writing instructions into the instruction queue buffers 102-1–102-n one by one. The write control process is carried out in response to a queue write signal (instruction) generated by a microprogram control unit 107. A selector 105 selects either the internal bus BS1 or the instruction bus BS2 in response to a queue reading signal (instruction) generated by the microprogram control unit 107. The selected bus is connected to the instruction queue circuit 100. A queue reading controller 104, which is connected to the instruction queue circuit 100, executes a read control process for sequentially reading the instructions from the registers 102-1–102-n one by one. The read control process is performed in response to a queue switching signal (instruction) generated by the microprogram control unit 107. A gate circuit 106 is connected between the instruction queue circuit 100 and the internal bus BS1, and selectively connects the circuit 100 and the internal bus BS1 in response to a queue input selection signal (instruction) generated by the microprogram control unit 107.

The microprogram control unit 107 comprises a decoder 108 and a micro-ROM 109, and generates control signals for controlling the selector 105, the queue writing controller 103, the queue reading controller 104, and the gate circuit 106. The micro-ROM 109 stores microinstructions. The decoder 108 decodes microinstructions, read from the micro-ROM 109, into the above-mentioned control signals.

Figure 1:
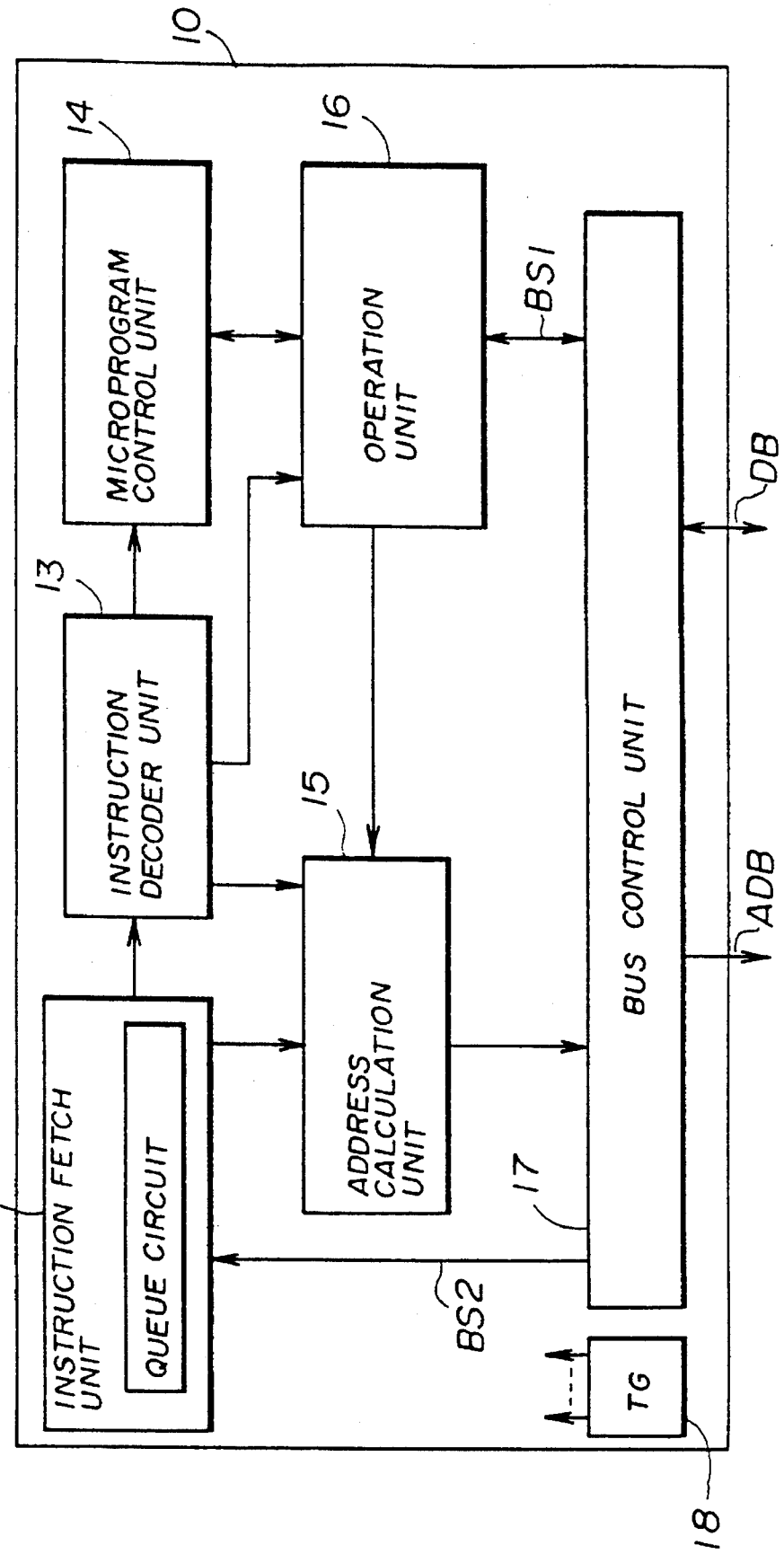
FIG. 1 is a block diagram of a CPU.
Figure 2:
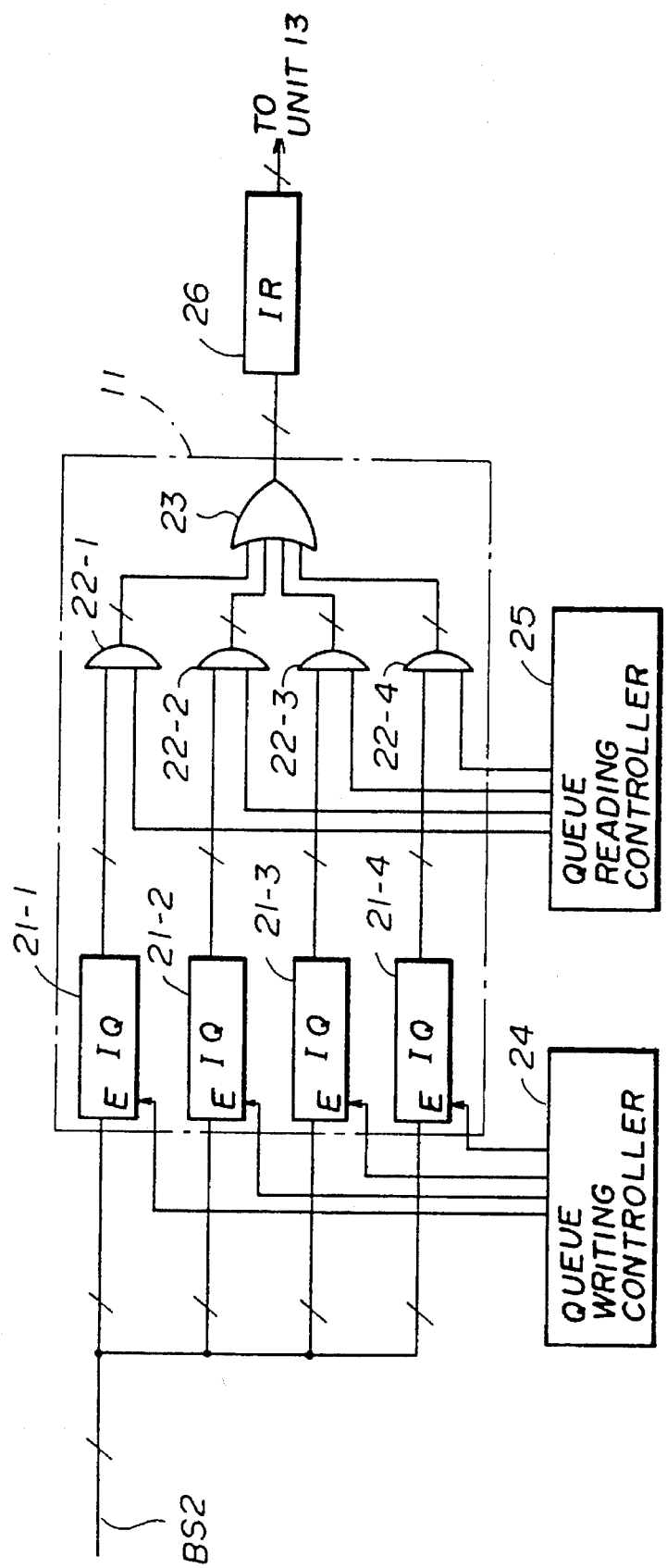
FIG. 2 is a block diagram of an instruction fetch circuit used in the CPU shown in FIG. 1.

When the instruction queue circuit 100 is tested, the microprogram control unit 107 causes the selector 105 to select the internal bus BS1, and then causes the queue writing controller 103 to write information transferred via the internal bus BS1 into an instruction queue buffer 102-i (i=1, 2, . . . , n). Thereafter, the microprogram control unit 107 causes the gate circuit 106 to connect the instruction queue circuit 100 and the internal bus BS1. In the above manner, the instruction read from the instruction queue circuit 100 can be output to the internal bus BS1, and then output to an external device via the bus control unit 17 (FIG. 1). It is to be noted that the instruction read from the instruction queue circuit 100 can be directly output to the internal bus without passing through some structural elements, such as the instruction decoder unit 13 and the execution unit 16. Hence, it is possible to determine, with high precision, whether or not the instruction queue circuit 100 is normally operating.

The control signal output from the queue reading controller 104 is also applied to the queue writing controller 103, which is informed which one of the instruction queue buffers 102-1–102-n is selected by the queue reading controller 104.

Figure 4:
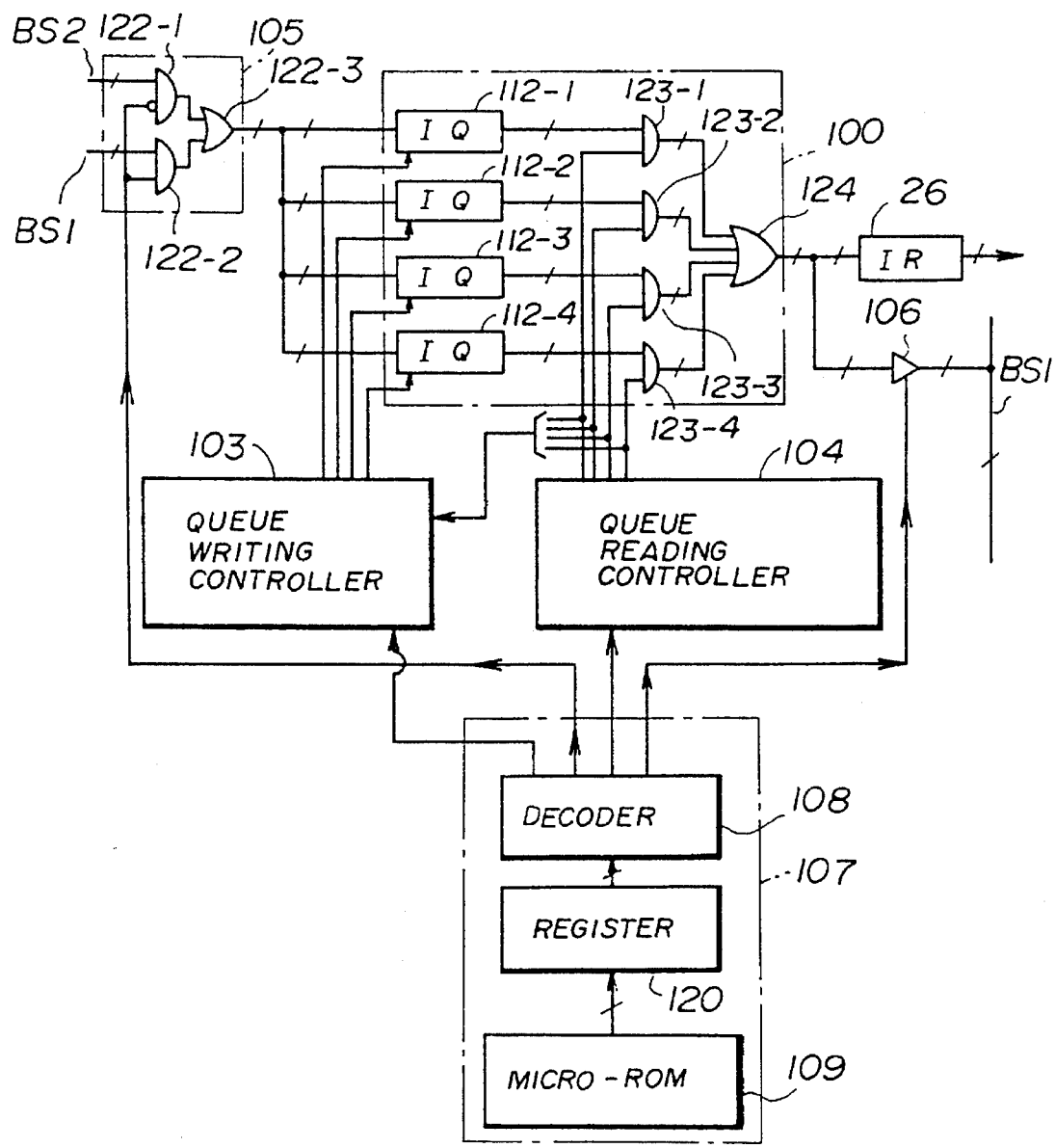
FIG. 4 is a block diagram showing the details of the structure of the configuration shown in FIG. 3.

FIG. 4 shows the details of the system shown in FIG. 3. In FIG. 4, parts that are the same as parts shown in FIG. 3 are given the same reference numbers as previously. The instruction queue circuit 100 comprises instruction queue buffers (IQ) 112-1–112-4, AND gates 123-1–123-4, and an OR gate 124. The instruction queue buffers 112-1–112-4 are enabled by respective control signals (write enable signals) output from the queue writing controller 103. The AND gates 123-1–123-4 respectively connected to the registers 112-1–112-4 are controlled by respective control signals (queue read signals) output from the queue reading controller 104. The output terminal of the OR gate 124 is connected to the instruction register 26, and the gate circuit 106. The selector 105 comprises an one-input-inverted-type AND gate 122-1, an AND gate 122-2 and an OR gate 122-3. The non-inverting multiple-bit input terminal of the AND gate 122-1 is connected to the instruction bus BS2, and the inverting input terminal thereof receives the queue input selection signal from the decoder 108. It will be noted that, for the sake of convenience, components such as AND gate 122-1 and OR gate 122-3 are treated in the text as having single-bit input or output terminals although by implication of their function, in the circuit, some such terminals are in fact multiple-bit. These components perform parallel operations on the multiple-bit data. For example, AND gate 122-1 performs a logical AND of its single inverting input with each of the data input on the bus BS2, outputting a parallel multiple-bit result. One input terminal of the AND gate 122-2 is connected to the internal bus BS1, and the other input terminal thereof receives the queue input selection signal from the decoder 108. The output terminals of the AND gates 122-1 and 122-2 are connected to input terminals of the OR gate 122-3. The output terminal of the OR gate 122-3 is connected to the input terminals of the instruction queue buffers 112-1–112-4. The microprogram control unit 107 comprises a microprogram register 120 connected between the micro-ROM 1-9 and the decoder 108.

Figure 5:
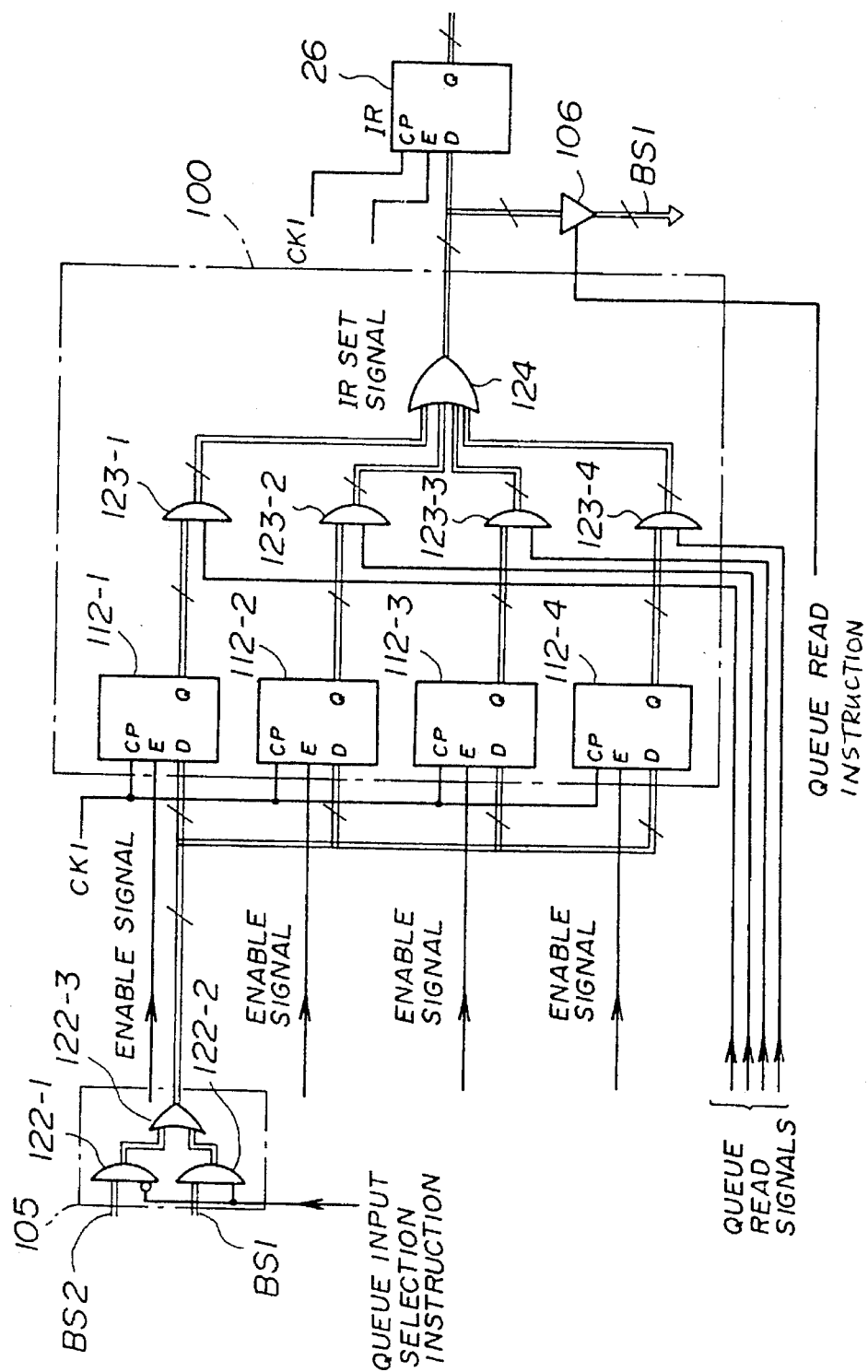
FIG. 5 is a block diagram showing an instruction queue circuit shown in FIG. 4.

FIG. 5 shows the instruction queue circuit 100 in detail. In FIG. 5, parts that are the same as parts shown in the previously described figures are given the same reference numbers. The instruction queue buffers 112-1–112-4 are respectively formed with D-type flip-flops, which have enable terminals E receiving the respective write enable signals from the decoder 108, data terminals D connected to the output terminal of the OR gate 122-3, and clock terminals CP receiving a clock signal CK1 generated by the timing generator 18 provided in the CPU. The output terminals Q of the flip-flops 112-1–112-4 are connected to the AND gates 123-1–123-4, respectively. The instruction register 26 is formed with a D-type flip-flop, which has an enable terminal E receiving the queue read signal from the decoder 108, a data terminal D connected to the output terminal of the OR gate 124, and a clock terminal CP receiving the clock signal CK1. The output terminal Q of the flip-flop 26 is connected to the instruction decoder unit 13 (FIG. 1).

Figure 6:
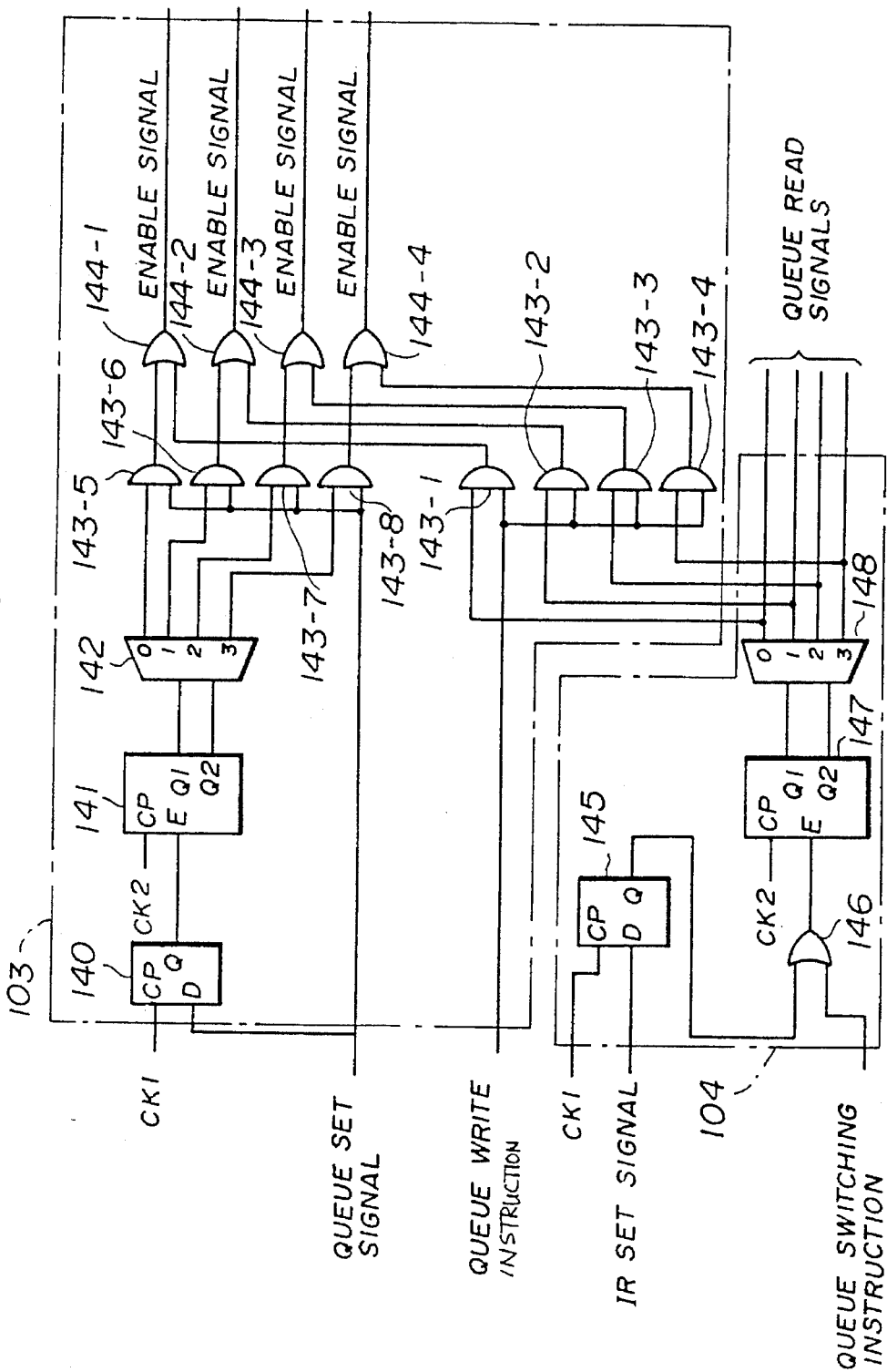
FIG. 6 is a block diagram showing a queue writing controller and a queue reading controller shown in FIG. 4.

FIG. 6 shows the details of the queue writing controller 103 and the queue reading controller 104. The queue writing controller 103 comprises a D-type flip-flop 140, a queue writing counter 141, a decoder 142, AND gates 143-1–143-8, and OR gates 144-1–144-4. The flip-flop 140 latches, in synchronism with the clock signal CK1, a queue set signal supplied from the instruction queue circuit 100 when data transferred via the internal bus BS1 has been written into one of the instruction queue buffers 112-1–112-4. The output terminal Q of the flip-flop 140 is connected to an enable terminal E of the counter 141, which operates in synchronism with a clock signal CK2 generated by the timing generator 18. The decoder 142 decodes a two-bit signal from the counter 141 into four bits, which are respectively applied to the AND gates 143-5–143-8. One of the four bits output from the counter 142 is active, and the other three bits are inactive. The output signals of the AND gates 143-5–143-8 are connected to the OR gates 144-1–144-4. The AND gates 143-1–143-4 respectively receive four bits of the queue read signal output from the queue reading controller 104, as well as the queue write signal from the decoder 108. The output terminals of the AND gates 143-1–143-4 are connected to the OR gates 144-1– 144-4. When the instruction queue circuit 100 is tested (test mode), the queue write signal is activated. In an ordinary mode, the queue set signal is kept activated.

The queue reading controller 104 comprises a D-type flip-flop 145, an OR gate 146, a queue reading counter 147, and a decoder 148. The flip-flop 145 latches an instruction register (IR) set signal output from the decoder 108 in synchronism with the clock signal CK1, and outputs it to the OR gate via its output terminal Q. The OR gate 146 receives the queue switching signal from the decoder 108. The output terminal of the OR gate 146 is connected to an enable terminal E of the counter 147, which operates in synchronism with the clock signal CK2. The decoder 148 decodes two bits output from the counter 147, and activates one of four output bits forming the queue reading signal.

Figure 7:
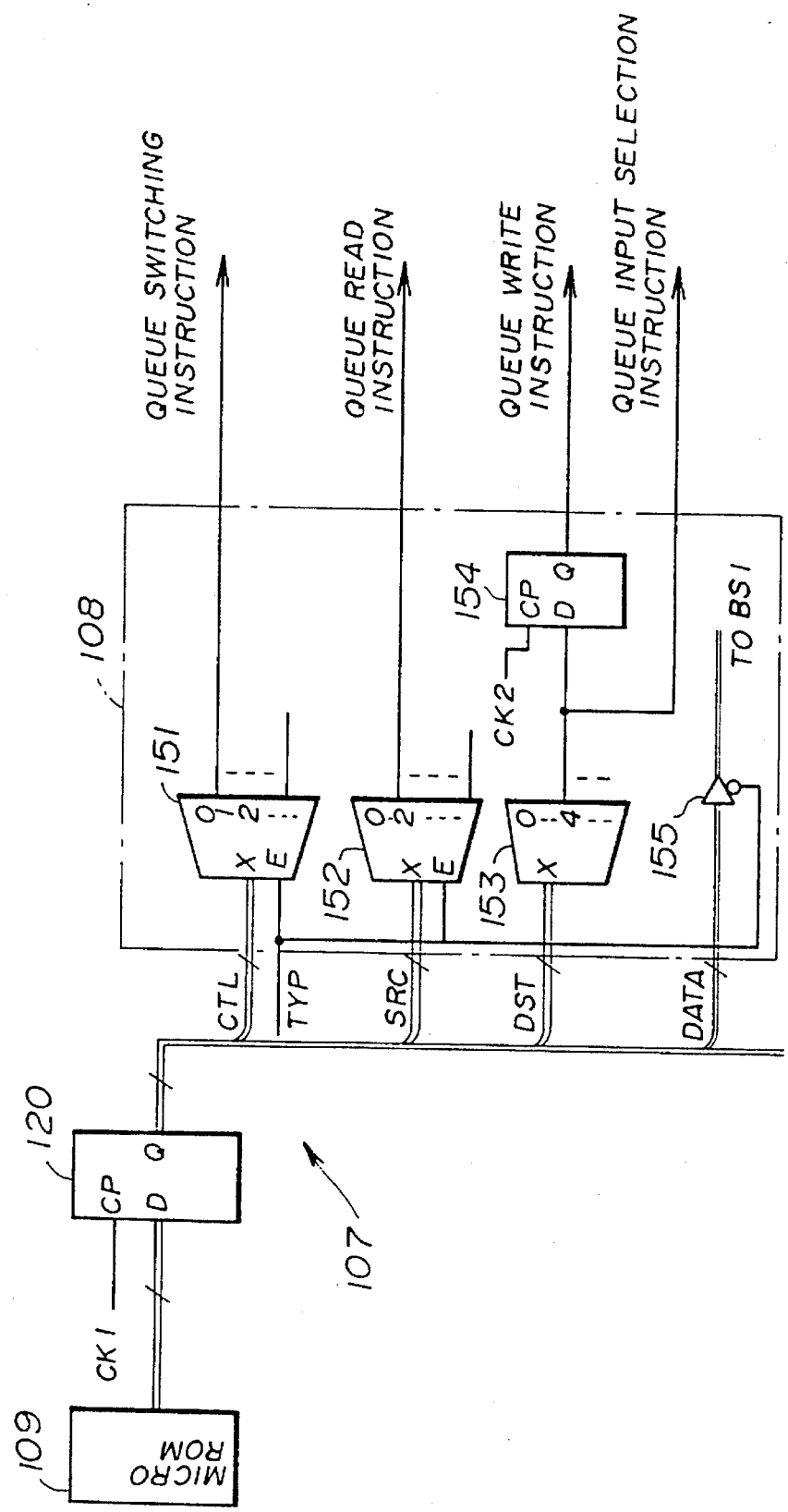
FIG. 7 is a block diagram showing a decoder of a microprogram control unit shown in FIG. 4.

FIG. 7 shows the structure of the decoder 108, which comprises a CTL-field decoder 151, an SRC-field decoder 152, a DST-field decoder 153, a D-type flip-flop 154 and a three-state buffer 155. The CTL-field decoder 151 decodes information contained in a control (CTL) field of a microinstruction output from the microprogram register 120, which is formed with a D-type flip-flop. The control field is used for specifying various controls. The output signal of the decoder 151 is the queue switching signal applied to the queue reading controller 104. The SRC-field decoder 152 receives information contained in an SRC (source) field of the microinstruction, and generates the queue read signal applied to the gate circuit 106. The information in the SRC field specifies an input operand. The DST field decoder 153 receives information contained in a DST (destination) field of the microinstruction, and generates the queue input selection signal applied to the selector 105. The information in the DST field specifies a destination. The queue input selection signal is latched by the flip-flop 154 in synchronism with the clock signal CK2, and is then output, as the queue write signal, to the queue writing controller 103. The three-state buffer 155 receives information contained in a DATA field of the microinstruction, and outputs it to the internal bus BS1 as internal bus information. The information in the data field is data having a fixed length.

In the mode in which the instruction queue circuit 100 is tested, the selector 15 receives the queue input selection instruction from the decoder 108, and internal bus information transferred via the internal bus BS1 is applied to the instruction queue circuit 100. Then, the decoder 108 outputs the queue write instruction to the queue writing controller 103, which causes the internal bus information to be written into one of the instruction queue buffers 112-1–112-4 by activating one of the write enable signals. Thereafter, the decoder 108 outputs the queue switching instruction to the queue reading controller 104, which activates one of the AND gates 123-1–123-4. Hence, the internal bus information is read from the corresponding instruction queue buffer, and is applied to the instruction register 26 and the gate circuit 106. At this time, the decoder 108 outputs the queue read instruction to the gate circuit 106, which allows the internal bus information from the instruction queue circuit 100 to be output to the internal bus BS1. The four-bit queue read signal from the queue reading controller 104 is applied to the queue writing controller 103, which is notified of the idle instruction queue buffer from which the internal bus information has been read. The internal bus information for testing the instruction queue circuit 100 is supplied, as a microinstruction, by the microprogram control unit 107.

The two formats of microinstructions will be described with reference to FIGS. 8A through 8E. One of the two formats of microinstructions is a data type format shown in FIG. 8A, and the other format is an operation type format shown in FIG. 8B. The data type format shown in FIG. 8A, which has a type flag TYP of 0, is used for setting of data having a fixed length, and the operation type format shown in FIG. 8B, which has a type flag TYP of 1, is used for an operation process. The data type format shown in FIG. 8A has a NEXT field in addition to the aforementioned DST field and the DATA field. The NEXT field shown in FIG. 8A contains information used to specify the address of the microprogram to be executed next. As shown in FIG. 8E, a code "100" is assigned to the DST field.

The operation type format shown in FIG. 8B has an ALU field in addition to the CTL field, the DST field, the SRC field and the NEXT field. The ALU field contains information used to specify the type of the operation to be executed next. As shown in FIG. 8C, a code "010" is assigned to the SRC field. As shown in FIG. 8D, a code "001" is assigned to the CTL field.

Each microinstruction having either the data-type format or the operation-type format is applied from the micro-ROM 109 to the decoder 108 via the microprogram register 120. The SRC field decoder 152 of the decoder 108 decodes the code "010" in the SRC field of the received microinstruction and generates the queue read instruction applied to the gate circuit 106. The DST field decoder 153 decodes the code "100" in the DST field of the received microinstruction and generates the queue write instruction. The CTL field decoder 151 decodes the code "001" in the CTL field of the received microinstruction and generates the queue input selection instruction.

Figure 9:
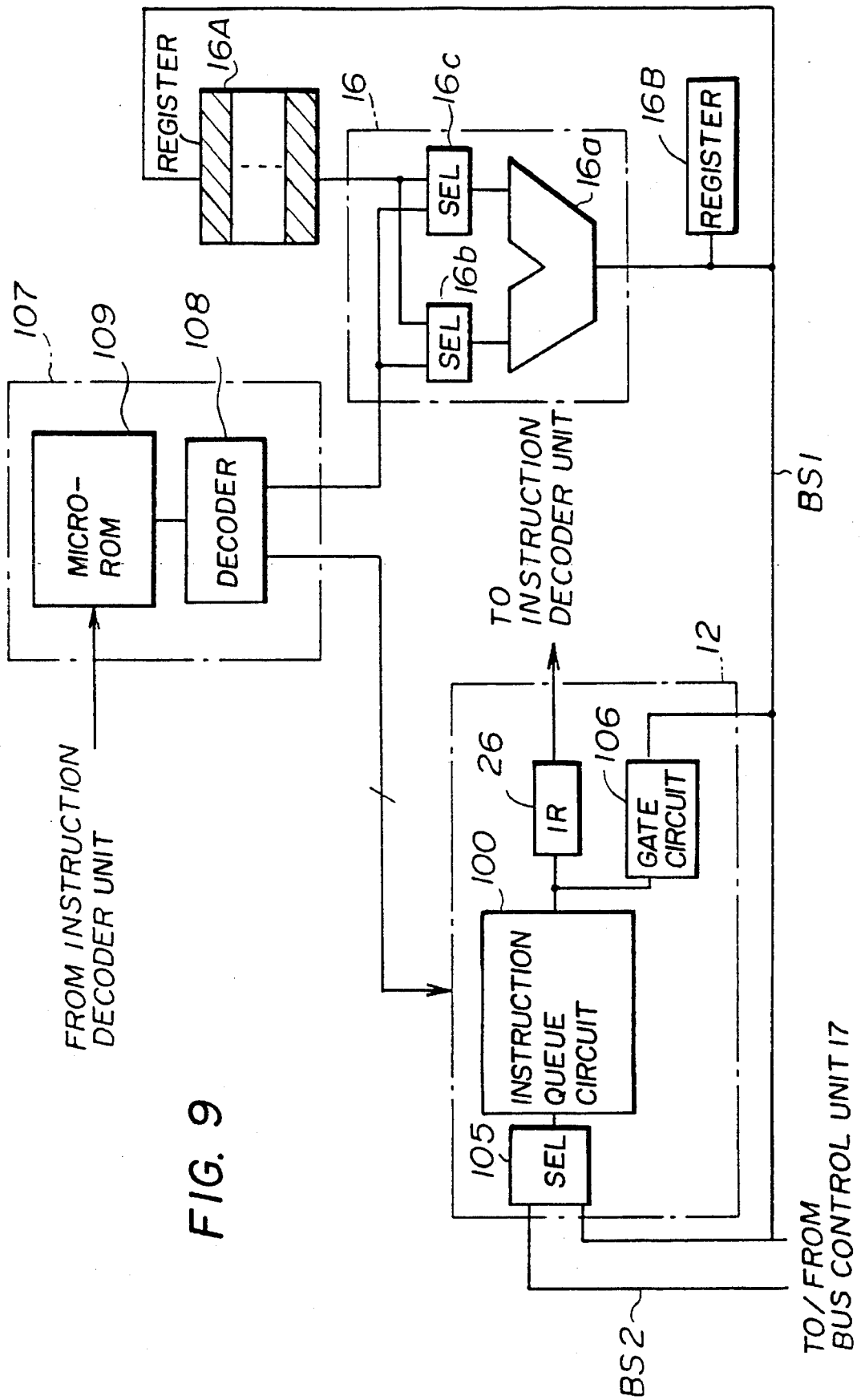
FIG. 9 is a block diagram showing the instructions queue circuit and its peripheral circuits.

FIG. 9 shows the instruction queue circuit 100 and some peripheral circuits thereof. In FIG. 9, parts that are the same as parts shown in the previously described figures are given the same reference numbers. The operation unit 16 comprises an ALU (Arithmetic and Logic Unit) 16a, and selectors 16b and 16c. The output terminal of the ALU 16a is connected to the internal bus BS1. A register 16A is connected between the output terminal of the ALU 16a and the selectors 16b or 16c. The selectors 16b and 16c are also connected to the microprogram control unit 107. The output terminals of the selectors 16b and 16c are connected to respective input terminals of the ALU 16a. In FIG. 9, only the instruction register 26, the instruction queue circuit 100, the selector 105 and the gate circuit 106 among the structural elements of the instruction fetch unit 12 are illustrated.

Figure 10:
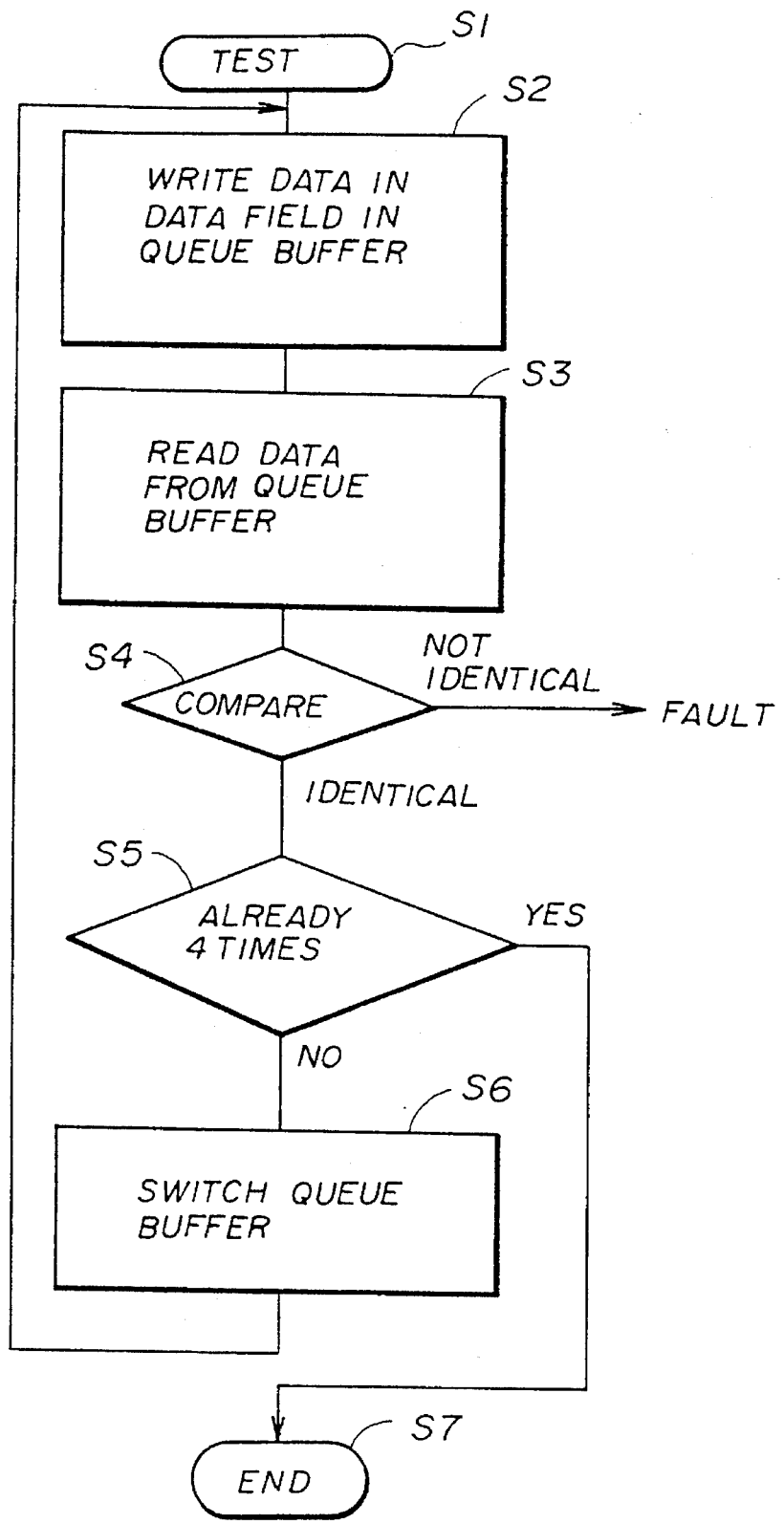
FIG. 10 is a flowchart showing a sequence for testing the instruction queue circuit.

FIG. 10 is a flowchart showing a sequence for testing the instruction queue circuit 100. After the sequence is started at step S1, arbitrary data is written into the instruction queue circuit 100 at step S2. More particularly, data for use in test is set in the DATA field of a microinstruction of the data type shown in FIG. 8A, and information indicating the instruction queue circuit 100 as the destination is written in the DST field thereof. The above instruction is read from the micro-ROM 109 and applied to the decoder 108 via the microprogram register 120. The three-state buffer 155 of the decoder 108 outputs the data in the data field to the internal bus BS1. In response to the queue write instruction and the queue input selection signal generated by the decoder 108, the data passing through the three-state buffer 155 is written into the instruction queue buffer specified by the counter 147 (FIG. 6). It will now be assumed that the data is written into the instruction queue buffer 112-1.

At step S3, the data written into the instruction queue buffer 112-1 is read therefrom by means of a microinstruction of the operation type shown in FIG. 8B. Data specifying the above instruction queue buffer 112-1 is written into the SRC field of the microinstruction, and the address of a storage area of the register 16A (FIG. 9) is written into the DST field thereof. The data is read from the instruction queue buffer 112-1 and passes through the gate circuit 106. Then, the data is transferred to the internal bus BS1 and is written into the storage area specified by the above microinstruction of the operation type.

At step S4, the ALU 16a compares the data set in the DATA field of the above-mentioned microinstruction and received via the selector 16b with the data read from the register 16A via the selector 16c. If a fault has occurred in the instruction queue circuit 100, the data from the selector 16b and the data from the selector 16c do not coincide with each other. It is possible to write data indicating the comparison result into an internal register 16B shown in FIG. 9. It is also possible to output data indicating the comparison result to an external device via the bus control unit 17.

At step S5, it is determined whether or not the sequence consist of steps S2–S4 has been repeatedly performed four times. Step S5 is intended to determine whether or not the four instruction queue buffers 112-1–112-4 have been checked. When the result obtained at step S5 is NO, the next microinstruction is read from the micro-ROM 109. The next microinstruction has, in its CTL field, data indicating the instruction queue buffer 112-2. Then, step S2 is performed. When the result obtained at step S5 is YES, the testing process is ended.

FIG. 11 is a timing chart showing the operation of the embodiment of the present invention that is operating in the ordinary mode. The clock signals CK1 and CK2 are 180° out of phase. The queue set signal is applied to the AND gates 143-5–143-8 (FIG. 6). In response to the four bits of the counter 142, one of the AND gates 143-5–143-8 is activated, and hence, the write enable signal is generated. When the write enable signal is output from the OR gate 144-1, the instruction queue buffer 112-1 is enabled, and the data (instruction n) transferred via the internal bus BS1 is written therein. In response to the queue set signal, the count value in the counter 141 is incremented by 1, and the queue writing controller 103 is ready to receive the next data.

The reading operation of the instruction queue buffers 112-1–112-4 is carried out independently of the writing operation thereof. When the instruction decoder unit 13 needs a new instruction, the IR set signal requesting that the next instruction is written into the instruction register 26 is generated and applied to the flip-flop 145 (FIG. 6). Then, the decoder 148 decodes the counter value of the counter 147 obtained at this time, and selects one of the instruction queue buffers 112-1–112-4 (in the example shown in FIG. 11, the instruction queue buffer 112-1 is selected). Then, the instruction n is read from the register 112-1 and written into the instruction register 26. Then, the counter value of the counter 147 is incremented by 1 in synchronism with the clock signal CK1.

The present invention is not limited to the particularly described embodiments, and variations and modifications may be made without departing from the scope of the present invention.

What is claimed is:

1. A system for testing an instruction queue circuit provided in a data processor and being connected to an external memory via a bus controller of the processor which further has a microprogram control unit which generates a first instruction, a second instruction and a third instruction prefetched in said processor, an operation unit connected to the microprogram control unit and to the instruction queue circuit via an internal bus wherein the instruction queue circuit includes a plurality of queue buffers for temporarily storing said first and second prefetched instructions, said testing system comprising:

writing means, coupled to the instruction queue circuit and the microprogram control unit, for writing internal bus information transferred via the internal bus and used to test the instruction queue circuit into the instruction queue circuit in response to said first instruction generated by the microprogram control unit;

reading means, coupled to the instruction queue circuit and the microprogram control unit, for reading the internal bus information from the instruction queue circuit in response to said second instruction generated by the microprogram control unit;

gate means, coupled to said microprogram control unit and said instruction queue circuit, for connecting said instruction queue circuit to said internal bus and for outputting the internal bus information read from said instruction queue circuit to the internal bus in response to said third instruction generated by the microprogram control circuit, the first, second and third instructions and the internal bus information being generated in the microprogram control unit by decoding microinstructions in the microprogram control unit; and selecting means, coupled directly to the microprogram control unit and the instruction queue circuit and also coupled to said internal bus and an instruction bus, for selecting either the internal bus or the instruction bus to be coupled to the external memory via the bus controller in response to a fourth instruction generated by the microprogram control unit and for connecting a selected bus to the instruction queue circuit so as to switch said instruction queue circuit to an operation mode or a testing mode.

2. The system as claimed in claim 1, wherein:

said writing means comprises first means for sequentially specifying one of the queue buffers so that the internal bus information is written into said one of the queue buffers; and said reading means comprises second means for sequentially specifying one of the queue buffers so that the internal bus information is read from said one of the queue buffers.

3. The system as claimed in claim 2, wherein said writing means comprises third means for receiving information indicating which one of the queue buffers is selected by said second means and for making the first means select said one of the queue buffers selected by said second means.

4. The system as claimed in claim 1, further comprising:

first register means, connected to the internal bus, for storing the internal bus information output through the gate means and transferred via the internal bus; and second register means, coupled to the internal bus, for storing a result of comparison of the internal bus information stored in and read from the first register means and internal bus information output from the microprogram control unit.

5. A data processor comprising:

a microprogram control unit for generating a first instruction, a second instruction and a third instruction, said first, second and third instructions being prefetched;

an instruction queue circuit connected to an external memory via a bus controller and being coupled to said microprogram control unit and including a plurality of queue buffers for temporarily storing said first and second prefetched instructions;

an operation unit connected to the microprogram control unit and which is also connected, via an internal bus, to the instruction queue circuit;

writing means, coupled to the instruction queue circuit and the microprogram control unit, for writing internal bus information transferred via the internal bus and used for testing the instruction queue circuit into the instruction queue circuit in response to said first instruction generated by the microprogram control unit;

reading means, coupled to the instruction queue circuit and the microprogram control unit, for reading the internal bus information from the instruction queue circuit in response to said second instruction generated by the microprogram control unit;

gate means, coupled to the microprogram control unit and said instruction queue circuit for connecting said instruction queue circuit to said internal bus and for outputting the internal bus information read from said instruction queue circuit to the internal bus in response to said third instruction generated by the microprogram control unit, wherein the microprogram control unit comprises:

a micro-ROM storing microinstructions; and decoder means, coupled to the micro-ROM, for decoding the microinstructions received from said micro-ROM and generating control signals from said microinstructions, said first, second and third instructions corresponding to the control signals; and selecting means, coupled directly to the instruction queue circuit and the microprogram control unit and also coupled to the internal bus and an instruction bus, for selecting either the internal bus or the instruction bus to be coupled to the external memory via the bus controller in response to a fourth instruction generated by the microprogram control unit and for connecting a selected bus to the instruction queue circuit so as to switch said instruction queue circuit to an operation mode or a testing mode.

6. The processor as claimed in claim 5, wherein:

said writing means comprises first means for sequentially specifying one of the queue buffers so that the internal bus information is written into said one of the queue buffers; and said reading means comprises second means for sequentially specifying one of the queue buffers so that the internal bus information is read from said one of the queue buffers.

7. The processor as claimed in claim 6, wherein said writing means comprises third means for receiving information indicating which one of the queue buffers is selected by said second means and for making the first means select said one of the queue buffers selected by said second means.

8. The processor as claimed in claim 5, further comprising:

first register means, connected to the internal bus, for storing the internal bus information output through the gate means and transferred via the internal bus; and second register means, coupled to the internal bus, for storing a result of comparison of the internal bus information stored in and read from the first register means and internal bus information output from the microprogram control unit.

* * * * *